United States Patent
Nallapa

(10) Patent No.: US 7,058,755 B2
(45) Date of Patent: Jun. 6, 2006

(54) EEPROM EMULATION IN FLASH MEMORY

(75) Inventor: Venkatapathi R. Nallapa, West Bloomfield, MI (US)

(73) Assignee: Ballard Power Systems Corporation, Dearborn, MI (US)

( * ) Notice: Subject to any disclaimer, the term of this patent is extended or adjusted under 35 U.S.C. 154(b) by 317 days.

(21) Appl. No.: 10/658,124

(22) Filed: Sep. 9, 2003

(65) Prior Publication Data

US 2005/0055496 A1 Mar. 10, 2005

(51) Int. Cl.
*G06F 12/00* (2006.01)
(52) U.S. Cl. .................. 711/103; 711/100; 711/154; 711/220
(58) Field of Classification Search ................ 711/103, 711/100, 154, 220
See application file for complete search history.

(56) References Cited

U.S. PATENT DOCUMENTS

| 5,345,413 | A | * | 9/1994 | Fisher et al. .................. 365/96 |
| 5,438,573 | A | * | 8/1995 | Mangan et al. ............. 714/711 |
| 5,471,478 | A | * | 11/1995 | Mangan et al. ............. 714/711 |
| 5,740,396 | A | | 4/1998 | Mason ........................ 711/103 |
| 6,038,636 | A | * | 3/2000 | Brown et al. ................ 711/103 |

FOREIGN PATENT DOCUMENTS

| EP | 0 991 081 A1 | 4/2000 |
| JP | 4-105300 | 4/1992 |
| JP | 8-17192 | 1/1996 |

OTHER PUBLICATIONS

"EEPROM Replacement with Flash Memory—Intel Application Note AP-685," Intel Corporation, Denver, CO, Dec. 1998, pp. 1-20.
Hazen, P., "Using Intel's Boot Block Flash Memory Parameter Blocks to Replace Eeprom—Intel Application Note AP-604," Intel Corporation, Denver, CO, Nov. 1995, pp. 1-6.
"Am29F200B Data Sheet," Advanced Micro Devices (AMD), Publication # 21526, Rev: C Amendment/+2, Sunnyvale, CA, Nov. 1999, pp. 1-39.
STMicroelectronics, "Flash+, Exit the Emulation Compromise," ST Challenge, 4th Edition, 1997, retrieved from http://us.st.com/stonline/press/magazine/challeng/4thedit/chal5.htm., pp. 1-3.

* cited by examiner

*Primary Examiner*—Stephen C. Elmore
(74) *Attorney, Agent, or Firm*—Seed IP Law Group PLLC

(57) ABSTRACT

An efficient emulation of EEPROM employing flash memory employs a fixed location for an address pointer in flash memory and such that an erase operation is required only once every nth update where n is the number of bits at the fixed location, thus avoiding the need to erase the sector on every update and avoiding delays associated with linked lists for determining the address of the most up-to-date information. Use of bit shifting provides fast determination of the desired address.

24 Claims, 7 Drawing Sheets

EEPROM EMULATION IN FLASH MEMORY

BACKGROUND OF THE INVENTION

1. Field of the Invention

This disclosure is generally related to static memory, and more particularly to storing large amounts of information such as diagnostic freeze frames to save information such as parameters useful in diagnostic analysis of fault conditions.

2. Description of the Related Art

Current automotive embedded controller designs contain both a flash memory part for code and small amounts of EEPROM for calibrations and diagnostic information. Recent applications require storing large amounts of diagnostic freeze frames to save variables corresponding to system operating parameters, for example, in order to help in service diagnostic analysis on detection of a fault. Saving large amounts of data in EEPROM would require accepting the higher cost of larger and expensive chips, using more expensive flash devices that contain both flash and EEPROM cells, or using software emulation. The use of flash devices as replacement for EEPROMS are generally discussed in "EEPROM Replacement with Flash Memory", INTEL Application Note AP-685; "Using INTEL's Boot Block Flash Memory Parameter Blocks To Replace EEPROM", INTEL Application Note AP-604; and AM29F200B Data Sheet from AMD.

Software emulation poses a variety of challenges. To overcome the limitations that a flash memory cell must be erased prior to being reprogrammed, if the application stores the freeze frames at fixed locations, the entire block/sector of the flash memory must be erased every time. An alternative would be to write each new frame to a different fresh location and maintain a string of linked address pointers to locate the latest frame. When the entire sector is filled up, the sector will have to be erased and the process starts over. In order to retrieve the location of the last updated frame, the software must start at the initial location and follow the chain of pointers to locate the most recent update. This can take a significant amount of time.

BRIEF SUMMARY OF THE INVENTION

In one aspect, a method of storing data comprises storing a first set of data to a first set of contiguous memory locations of a flash memory; setting at least a first bit of a pointer at a fixed set of memory locations of the flash memory, the at least first bit indicating an address of the first set of contiguous memory locations of the flash memory; storing a second set of data to a second set of contiguous memory locations of the flash memory; setting at least a second bit of the pointer, the at least second bit indicating an address of the second set of contiguous memory locations of the flash memory; and erasing at least the pointer after a last bit in the pointer has been set. The method may further comprise determining a most recent one of the sets of data upon an occurrence of a power up event by bit shifting the pointer in an order from a last bit in the pointer to a first bit in the pointer.

In another aspect, a method of emulating an electrically erasable programmable read only memory using a flash memory comprises storing successive sets of data to respective ones of a number of locations of a flash memory; for each of the sets of data, setting at least one respective bit of a number of bits of a pointer stored in the flash memory before storing a next one of the sets of data, the at least one bit indicative of the location in the flash memory at which the respective set of data is stored; and after a last bit in the pointer has been set, erasing a sector of the flash memory containing the pointer and the stored sets of data.

In still another aspect, an apparatus to emulate an electronically erasable programmable read only memory using a flash memory comprises a flash memory; means for storing successive sets of data to respective ones of a number of locations of contiguous memory of the flash memory; means for storing successive sets of data to respective ones of a number of locations of contiguous memory of the flash memory; means for erasing a sector of the flash memory containing the pointer and the stored sets of data after a last bit in the pointer has been set.

In yet another aspect, an apparatus to emulate an electronically erasable programmable read only memory using a flash memory comprises a flash memory; a processor configured to store successive sets of data to respective ones of a number of locations of contiguous memory of the flash memory; to set at least one respective bit of a number of bits of a pointer stored in the flash memory for each of the sets of data, before storing a next one of the sets of data, the at least one bit indicative of the location in the flash memory at which the respective set of data is stored; and to erase a sector of the flash memory containing the pointer and the stored sets of data after a last bit in the pointer has been set.

In a further aspect, a processor-readable media stores instructions for causing a processor to store data, by storing successive sets of data to respective ones of a number of memory locations of a flash memory, each memory location comprising a number of contiguous words; for each of the sets of data, setting at least one respective bit of a number of bits of a pointer stored in the flash memory before storing a next one of the sets of data, the at least one bit indicative of the memory location in the flash memory at which the respective set of data is stored, and after a last bit in the pointer has been set, erasing a sector of the flash memory containing the pointer and the stored sets of data.

In yet a further aspect, flash memory stores a data structure that comprises a plurality of sets of contiguous memory; and a pointer at a fixed location, the pointer comprising a number of bits, each bit indicative of a defined location of a respective one of the sets of contiguous memory.

BRIEF DESCRIPTION OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF THE INVENTION

In the following description, certain specific details are set forth in order to provide a thorough understanding of various embodiments of the invention. However, one skilled in the art will understand that the invention may be practiced without these details. In other instances, well-known structures associated with controllers such as micro-controllers or microprocessors, buses, buffers, registers, and memory devices such as static and dynamic random access memory (RAM), read only memory (ROM), flash memory, and/or electronically erasable programmable read only memory (EEPROM) have not been shown or described in detail to avoid unnecessarily obscuring descriptions of the embodiments of the invention.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment of the present invention. Thus, the appearances of the phrases "in one embodiment" or "in an embodiment" in various places throughout this specification are not necessarily all referring to the same embodiment. Further more, the particular features, structures, or characteristics may be combined in any suitable manner in one or more embodiments.

The headings provided herein are for convenience only and do not interpret the scope or meaning of the claimed invention.

Figure 1:
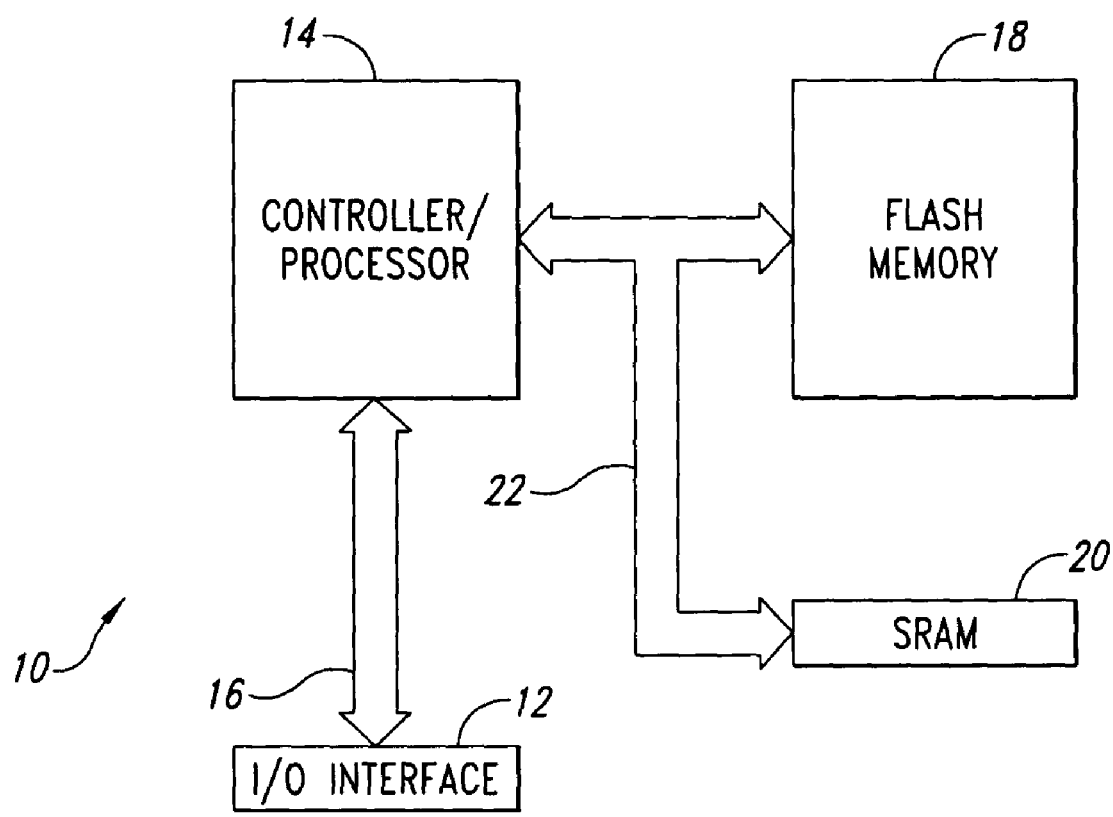
FIG. 1 is a block diagram of a system comprising an interface for receiving data, a controller such as a microcontroller or microprocessor, a first memory device such as a static random access memory and a second memory device such as a flash memory according to one illustrated embodiment.

FIG. 1 shows a system 10 comprising an input/output (I/O) interface 12 coupled to a controller 14 via a first bus 16. The controller 14 is coupled to a flash memory 18 and static RAM 20 via a bus 22. The controller 14 may take a variety of forms, for example, as a microprocessor or micro-controller such as the 80C167 micro-controller available from Siemens AG.

The system 10 may be useful in a variety of applications, for example, as an automotive embedded controller. In such applications, it is useful to store, from time to time, the values of various parameters which will aid in diagnosing faults, trouble conditions, or performance in general. Parameters may, for example, include fault or trouble codes or values for various operating parameters such as motor temperatures, inverter temperatures, lubricant pressures, voltages and currents, etc. The I/O interface 12 may take the form of a Controller Area Network (CAN) interface for coupling to various operating parameter sensors via a CAN compliant serial bus.

Figure 2A:
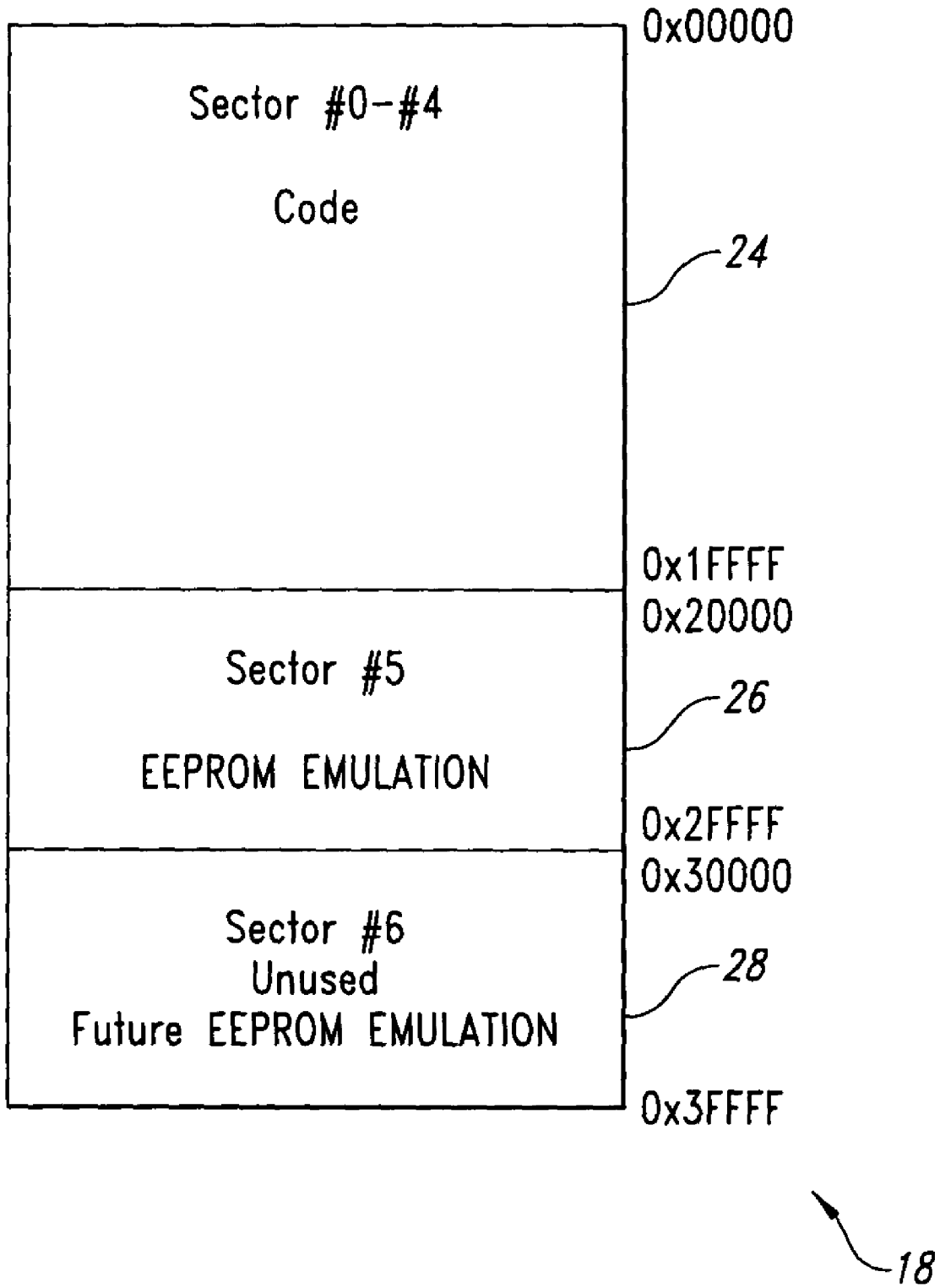
FIG. 2A is a schematic illustration of the organization of the flash memory of FIG. 1 according to one illustrated embodiment.

FIG. 2A illustrates the organization of the flash memory 18 according to one illustrated embodiment. The flash memory 18 may store instructions in a first number of sectors 24 (e.g., Sectors #0–#4). A sixth sector 26 (e.g. Sector #5) of the flash memory 18 may be used to perform EEPROM emulation, as explained in detail below. A seventh sector 28 (e.g. Sector #6) of the flash memory 18 may be unused, and may be reserved for future applications such as extended EEPROM emulation. In the illustrated embodiment, the first sector 24 of the flash memory 18 extends from address 0x00000 to 0x1FFFF inclusive, the sixth sector 26 extends from 0x20000 to 0x2FFFF inclusive, and the seventh sector 28 extends from 0x30000 to 0x3FFFF inclusive. All addresses in this description are provided in hexadecimal. The addresses are illustrative, and are not intended to define any absolute addresses, relative addresses, or any sizes.

Figure 2B:
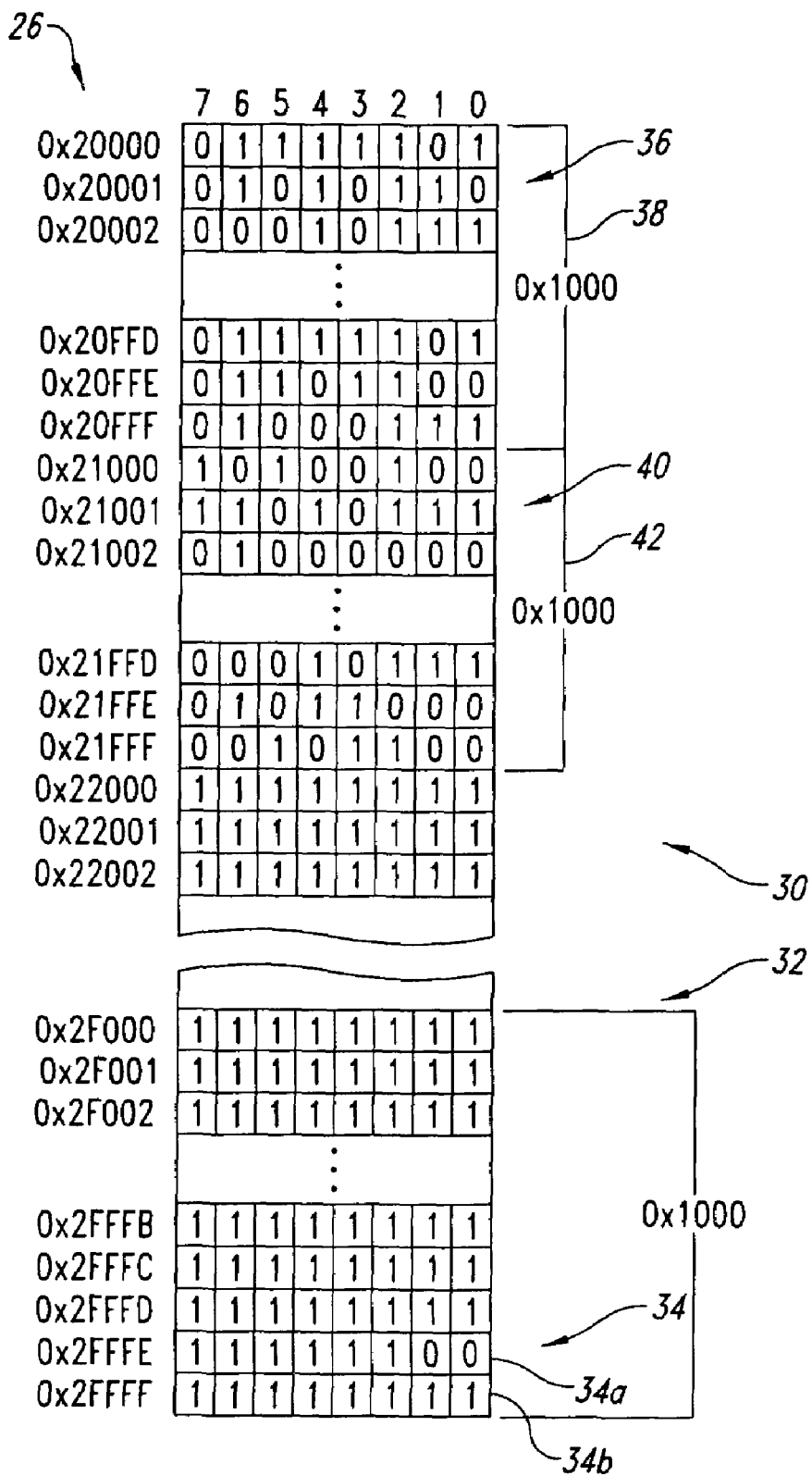
FIG. 2B is a schematic illustration of the organization of a portion of the flash memory of FIG. 2A according to one illustrated embodiment.

FIG. 2B illustrates the organization of the sixth sector 26 of the flash memory 18 used for EEPROM emulation. In this embodiment, the sixth sector 26 of flash memory 18 is organized as a large number of bytes, each byte comprised of eight bits (numbered 0–7 in FIG. 2B). Each byte is identified by an address illustrated along side the corresponding byte. A large number of the bytes in the sixth sector 26 are omitted from the illustration for the sake of clarity. As is typical, each bit of each word is a Boolean, capable of taking on two values commonly represented as 0 and 1. The system 10 may treat a number of bytes as word, for example, treating one byte as a low order byte and the other byte as a high order byte of the word, as is readily apparent to those of ordinary skill in the art. While illustrated as an 8 bit per byte memory architecture, one skilled in the art will recognize the ability to apply the concepts taught herein to other memory architectures.

As will be recognized by those skilled in the art, flash memory 18 can only be erased as a sector or block at a time. Erasing involves setting all of the bits in the sector to a first defined value, typically represented as 1. One skilled in the art will recognize that the use of 1 and 0 are conventional and could have been assigned inversely, or could be represented with other values such as True and False or ON and OFF.

One skilled in the art will further recognize that the flash memory 18 may be written on a bit-by-bit basis. Writing to the flash memory 18 allows the erased value (denominated as "1") to be maintained (i.e., 1) or changed (i.e., 0). For example, a portion 30 of the flash memory 18 has all bits set to 1 since it has yet to be written, while another portion 32 of the flash memory has some bits set to 1 and other bits set to 0 since it has already been written.

A pointer 34 may be stored at one or more fixed locations of the flash memory 18. For example, at the last word of the sixth sector 26, such as illustrated in FIG. 2B where the pointer 34 is stored in the last two bytes of sector 26, the low order byte of the pointer 34 stored at location 34a (i.e., 0x2FFFE) and high order byte stored at location 34b m(i.e., 0x2FFFF). As described herein, the bits of the pointer 34 may indicate an address for sets of data stored at various locations in the memory 18. For example, a first set of data 36 may be stored in a first set 38 of contiguous memory locations having a starting address indicated by the first bit (i.e., 0 bit of low order byte at location 34a) of the pointer 34. In one embodiment, the position of the set bit may indicate an offset from some starting address.

Likewise, a second bit (i.e., bit 1 of low order byte at location 34a) of the pointer 34 may identify the location of a second set of data 40 stored in a second set 42 of contiguous memory locations. As illustrated, only two bits of the pointer 34 are set (i.e., equal 0), indicating that only two sets of data are currently stored in the sixth sector 26 of the flash memory 18, the data being stored at respective sets of contiguous memory locations. As illustrated, the third through fifteenth bits are not set (i.e., equal 1), indicating that remainder of the locations in the sixth sector 26 of the flash memory 18 do not currently store data.

Figure 3:
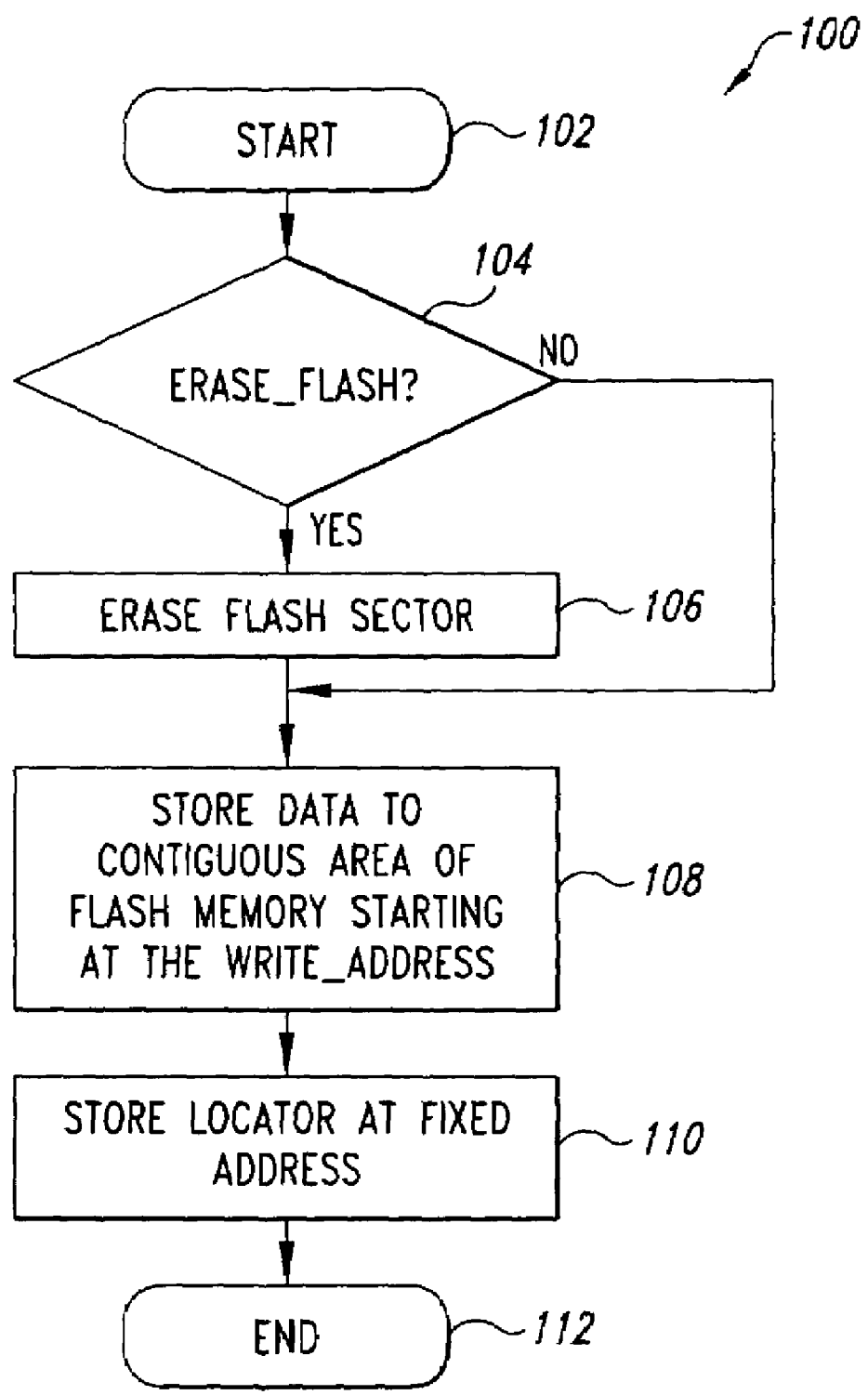
FIG. 3 is a flow diagram illustrating a method of storing data and updating a pointer in the flash memory of FIG. 1 according to one illustrated embodiment.

FIG. 3 shows a method 100 of storing data and updating the pointer 34 in the sixth sector 26 of the flash memory 18 according to one illustrated embodiment. Typically, the method 100 will start in step 102, on the occurrence of each power down event, to store various parameters, for example automotive system operating parameters which may be useful in diagnosing faults.

In step 104, the controller 14 determines whether the sixth sector 26 of the flash memory 18 should be erased. The sixth sector 26 may be erased each time the sixth sector 26 is full (i.e., each set of contiguous memory locations is written). The controller 14 can determine if the sixth sector 26 of the flash memory 18 is full by checking an erase flash flag ERASE_FLASH. If the sixth sector 26 is full, the controller 14 erases the sixth sector 26 of the flash memory 18 in step 106 by applying appropriate signals to the flash memory 18 as is known in the art. The controller 14 then passes control to step 108. If the sixth sector 26 of the flash memory 18 is not full, the controller 14 passes control directly to step 108.

In step 108, the controller 14 stores data to a set of contiguous memory locations in the sixth sector 26 of the flash memory 18 starting at a write address. Instep 110, the controller 14 sets the appropriate bit of the pointer 34 corresponding, and terminates the method 100 at step 112.

Figure 4:
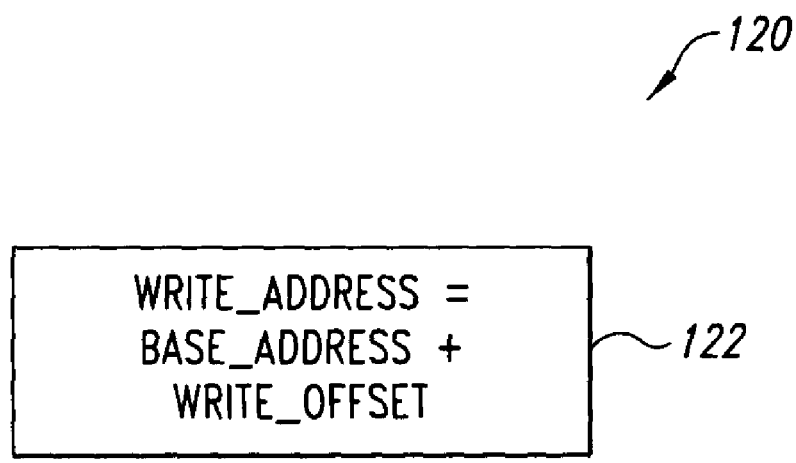
FIG. 4 is a flow diagram of a method of determining a write address for writing data to the flash memory of FIG. 1 according to one illustrated embodiment.

FIG. 4 shows a method 120 for determining the write address. In step 122, the controller 14 adds a write offset value WRITE_OFFSET to a base address value BASE_ADDRESS to determine the write address WRITE_ADDRESS. In the illustrated example, the base address is 0x20000.

Figure 5:
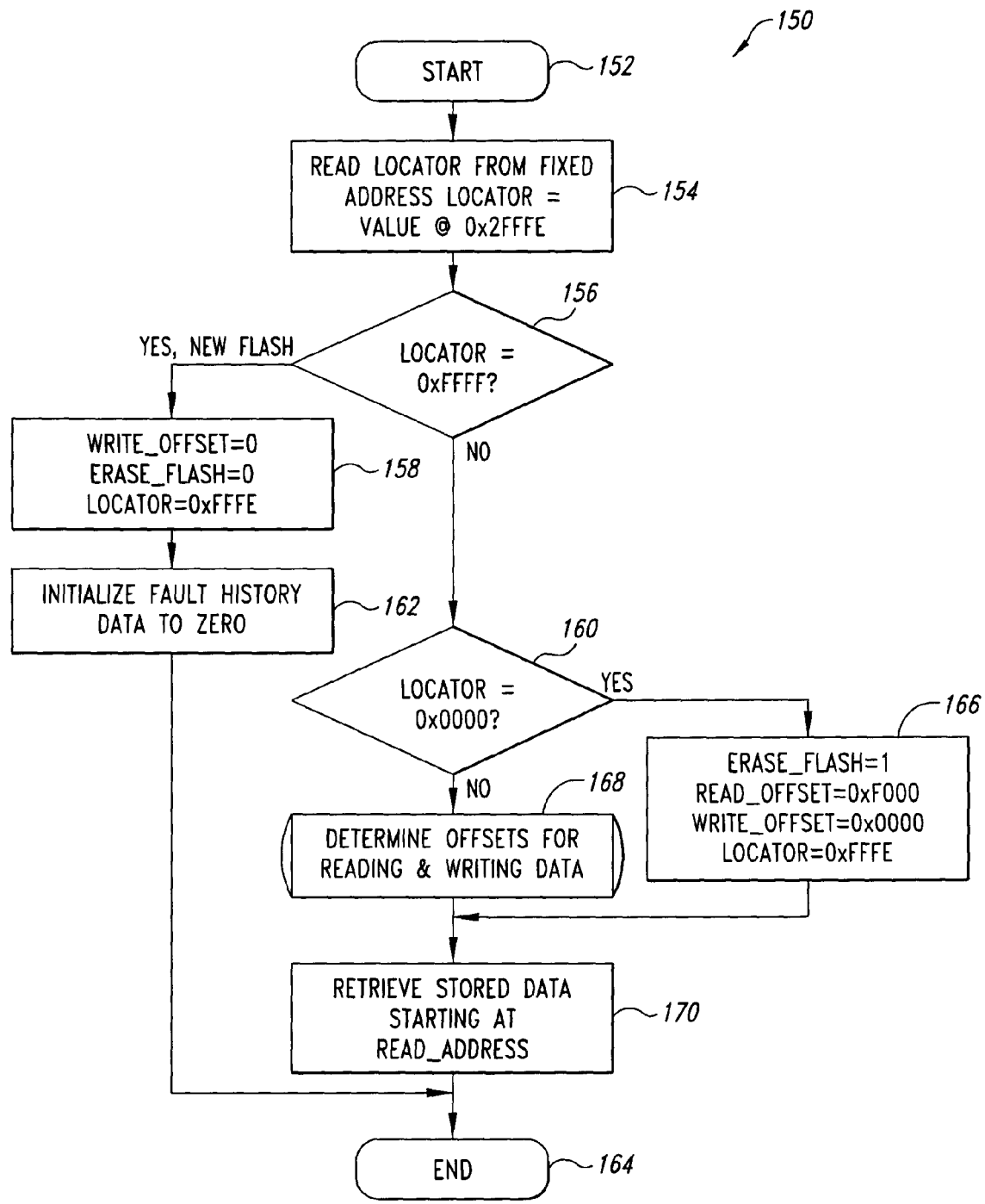
FIG. 5 is a flow diagram of a method of identifying and retrieving a most recently stored set of data from the flash memory of FIG. 1 according to one illustrated embodiment.

FIG. 5 shows a method 150 of identifying and retrieving stored information, for example, on a power up event, starting in step 152.

In step 154, the controller 14 reads the pointer 34 from the fixed locations 34a, 34b. In step 156, the controller 14 determines whether the sixth sector 26 of the flash memory 18 is initialized (e.g., flash memory 18 is new or sixth sector 26 is unused, for example when initially installed in a vehicle). For example, the controller 14 can determine if the sixth sector 26 is initialized by determining whether all of the bits of the pointer 34 are set to 1 (i.e., pointer equal 0xFFFF). If the sixth sector 26 is initialized, the controller 14 passes control to step 158. If the sixth sector 26 is not initialized, the controller 14 passes control to step 160.

In step 158, the controller 14 prepares to operate with the initialized sixth sector 26 of the flash memory 18. In particular, the controller 14 sets the write offset value WRITE_OFFSET equal to 0, sets the erase flash flag ERASE_FLASH equal to 0 (i.e., do not erase), and sets the pointer 34 such that only the first bit (bit 0) of the lower byte 34a is set to 0 (i.e., set pointer 34 equal to 0xFFFE). In step 162, the controller 14 initializes fault history data that is suppose to be read from the flash memory 18 to 0. Initializing the fault history data to 0 is performed because the flash memory 18 initially does not contain any stored information such as system operating parameters which may be useful in diagnosing faults. The controller 14 terminates the method 150 in step 164.

In step 160, the controller 14 determines if the sixth sector 26 of the flash memory 18 is full. For example, the controller 14 can determine if the sixth sector 26 is full by determining whether all of the bits of the pointer 34 are set to 0 (i.e., pointer 34 equal 0x0000). If the sixth sector 26 is full, the controller 14 passes control to step 166. If the sixth sector 26 is not full, the controller 14 passes control to step 168.

In step 166, the controller 14 prepares to erase the sixth sector 26 of the flash memory 18. In particular, the controller 14 sets the erase flash flag ERASE_FLASH equal to 1 (i.e., do erase), sets the read offset value READ_OFFSET equal to 0xF000 (READ_OFFSET equal 0xF000), sets the write offset value WRITE_OFFSET equal to 0 (WRITE_OFFSET equal 0x0000), and sets the pointer 34 such that only the first bit (bit 0) of the lower byte 34a is set to 0 (i.e., set pointer 34 equal to 0xFFFE). The controller then passes control to step 170.

In step 168, the controller 14 determines the read offset value READ_OFFSET and the write offset value WRITE_OFFSET, as described below with reference to FIG. 7.

In step 170, the controller 14 retrieves the data stored in the sixth sector 26 at the set of contiguous locations starting with the address given by a read address value READ_ADDRESS and extending to an address that is a defined maximum size value MAX_SIZE from the read address value READ_ADDRESS. The maximum size value MAX_SIZE corresponds to the length of the sets of contiguous memory for storing frames of data such as operating parameters. A suitable size may, for example, be 0x1000 or 4096 bytes. The controller 14 then terminates the method 150 at step 164.

Figure 6:
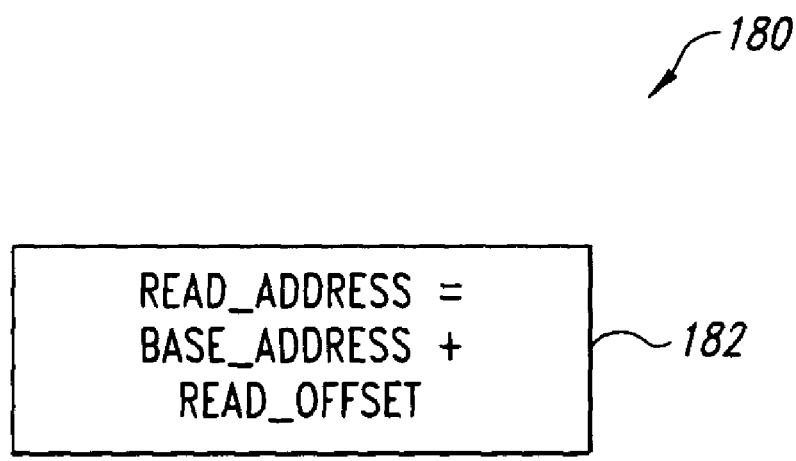
FIG. 6 is a flow diagram of a method of determining a read address for reading data from the flash memory of FIG. 1 according to one illustrated embodiment.

FIG. 6 shows a method 180 for determining the read address READ_ADDRESS. In step 182, the controller 14 adds a read offset value READ_OFFSET to a base address value BASE_ADDRESS to determine the read address READ_ADDRESS.

Figure 7:
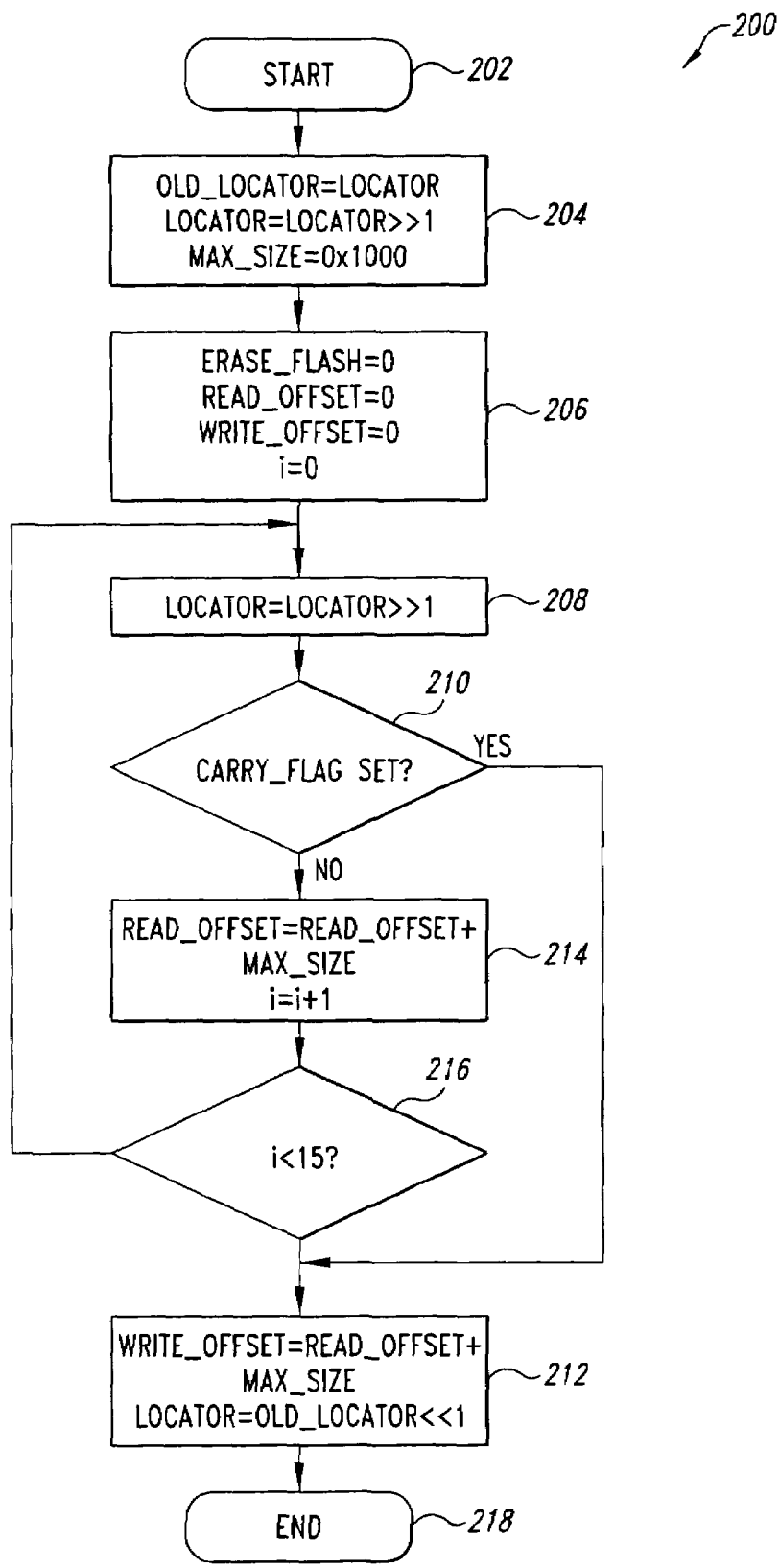
FIG. 7 is a flow diagram of a method of determining read and write offsets according to one illustrated embodiment.

FIG. 7 shows a method 200 of determining the read offset value READ_OFFSET and the write offset value WRITE_OFFSET, for example, suitable to execute as step 168 of method 150 of FIG. 5.

The method 200 starts at step 202. In step 204, the controller 14 sets an old location value OLD_LOCATOR equal to the locator value (i.e., value of pointer 34). In step 204, the controller 14 also bit shifts the locator value LOCATOR to the right with respect to the orientation of the flash 18 memory as illustrated in FIG. 2B. Also in step 204, the controller 14 sets a maximum size value MAX_SIZE equal to the desired length of the sets of contiguous memory locations (e.g., 0x1000 or 4096 bytes). In step 206, the controller 14 sets the erase flash flag ERASE_FLASH equal to 0 (i.e., do not erase), sets the read offset value READ_OFFSET equal to 0, sets the write offset value WRITE_OFFSET equal to 0, and sets a counter i equal to 0.

In step 208, the controller bit shifts the locator value LOCATOR to the right. In step 210, the controller 14 determines whether a carry flag CARRY_FLAG is set. If the carry flag CARRY_FLAG is set, the controller 14 passes control to step 212. If the carry flag CARRY_FLAG is not set, the controller 14 passes control to step 214.

In step 214, the controller 14 sets the read offset value READ_OFFSET equal to the read offset value READ_OFFSET plus the maximum size value MAX_SIZE, and increments the counter i.

In step 216, the controller 14 determines whether the counter i is less than the total number of bits (e.g., 15) in the pointer 34. If the counter i is less than the total number of bits in the pointer 34, the controller 14 returns control to step 208. Otherwise the controller 14 passes control to step 212.

In step 212, the controller 14 sets the write offset value WRITE_OFFSET equal to the read offset value READ_OFFSET plus the maximum size value MAX_SIZE, and bit shifts the old locator value OLD_LOCATOR to the left with respect to the orientation of the flash 18 memory as illustrated in FIG. 2B. The controller 14 than returns control to the method 150.

To summarize the above described operation, shifting to the right is essentially dividing by two, allowing the first non-zero bit starting at bit 0 to be quickly located and consequently quickly locating the most recently stored data. The controller 14 continues shifting right until a "1" is shifted out from bit 0 position into the carry flag CARRY_FLAG. To determine the next open location to write data, the previously saved value is simply shifted left by one bit, allowing the controller 14 to quickly determine the write location.

An abbreviated example is presented, employing a four bit pointer 34 for ease of presentation. The following sequence illustrates the four bit pointer 34 at each successive power down event:

1111→1110→1100→1000→0000→1110→1100→1000→0000→1110 where

1111—Initialization due to new flash memory or first use of sector

1110—Offset of 0x0000

1100—Offset of 0x1000 (4096 bytes or 4K)

1000—Offset of 0x2000

0000—Offset of 0x3000 (requires erase operation on next cycle)

As discussed above, upon power up, the next location to save data in the EEPROM emulation sector 26 of flash memory 18 is determined, and if necessary the sector 26 of the flash memory 18 is erased. In particular, the pointer 34 stored at a fixed location in the flash memory 18 is read to locate the most recent updated data frame. If the pointer 34 is 1111, the flash memory 18 is new and/or the sector 26 contains no data. If the pointer 34 is 0000, indicating that the sector 26 is full, the sector 26 is erased (i.e., 1111) and data stored to the first location in the sector 26 (i.e., pointer 34 set to 1110 identifying 0x0000 offset).

The computation of the offset is very fast since the pointer 34 is simply rotated right until the first non-zero bit is encountered, except in two situations a) 1111-flash memory 18 is new and/or sector 26 is empty; and b) 0000-sector 26 of flash memory 18 needs to be erased prior to programming. As discussed above, when using a 16 bit pointer, the sector 26 of the flash memory 18 only needs to be erased once ever seventeen cycles. Thus, overcoming the limitations of traditional software emulation of EEPROM using flash memory 18.

During operation (i.e., run-time), upon detection of a fault, the controller 14 logs parameter information to RAM 20, such as mileage, time and date stamp, and conditions just before and just after the fault. Faults may include a variety of conditions, a variety of parameters may be logged to RAM 20 during run-time, such as temperature, torque request, current and or voltage are logged to RAM during run-time.

On shut down, any parameters, for example, vehicle diagnostic or fault information collected and stored in the dynamic or static RAM 20 is copied to the appropriate location of the sector 26 of the flash memory 18 as part of the power down sequence. Importantly, the sector 26 of the flash memory 18 only needs to be erased on every nth sequence. For example, the sector 26 only erased every seventeenth time where the pointer 34 is 16 bits long.

The controller 14 may be programmed using assembly language in order to optimize speed, which may be important in some applications, for example, in automotive applications.

Although specific embodiments of and examples for the reader and method of the invention are described herein for illustrative purposes, various equivalent modifications can be made without departing from the spirit and scope of the invention, as will be recognized by those skilled in the relevant art. The teachings provided herein of the invention can be applied to readers for any machine-readable symbology, not necessarily the exemplary bar code reader generally described above.

While the embodiment discussed above starts with the least significant bit (i.e., bit 0), it is also possible to start with the most significant bit (i.e., bit 15). When staring with the most significant bit, the bit shift is to the right instead of to the left Such an embodiment, may employ the "Negative" flag rather than the "Carry" flag, or can use either.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the invention can be modified, if necessary, to employ systems, circuits and concepts of the various patents, applications and publications to provide yet further embodiments of the invention.

These and other changes can be made to the invention in light of the above-detailed description. In general, in the following claims, the terms used should not be construed to limit the invention to the specific embodiments disclosed in the specification and the claims, but should be construed to include all controllers and memory that operate in accordance with the claims. Accordingly, the invention is not limited by the disclosure, but instead its scope is to be determined entirely by the following claims.

I claim:

1. A method of storing data, the method comprising:

storing a first set of data to a first set of contiguous memory locations of a flash memory;

setting a single first bit of a pointer at a fixed set of memory locations of the flash memory, the first bit indicating an address of the first set of contiguous memory locations of the flash memory;

storing a second set of data to a second set of contiguous memory locations of the flash memory;

setting a single second bit of the pointer, the second bit being a next successive bit in the pointer to the first bit, the second bit indicating an address of the second set of contiguous memory locations of the flash memory; and erasing at least the pointer after a last bit in the pointer has been set.

2. The method of claim 1 wherein a position in the pointer of the first bit indicates an offset to the first set of contiguous memory locations.

3. The method of claim 1 wherein a position in the pointer of the first bit indicates an offset to the first set of contiguous memory locations and wherein a position in the pointer of the second bit indicates an offset to the second set of contiguous memory locations.

4. The method of claim 1 wherein setting at least a single first bit of a pointer comprises setting a least significant bit of the pointer and wherein setting at least a single second bit of the pointer comprises setting a next successive bit in the pointer with respect to the least significant bit in the pointer.

5. The method of claim 1, further comprising:
storing a number of additional sets of data to respective ones of a number of additional sets of contiguous memory locations of the flash memory; and
setting at least a number of additional bits of the pointer, each of the bits indicating an address of a respective one of the additional sets of contiguous memory locations of the flash memory.

6. The method of claim 5 wherein the pointer is a word and the bits in the pointer are set consecutively from a least significant bit to a most significant bit.

7. The method of claim 1 wherein erasing at least the pointer after a last bit in the pointer has been set comprises erasing a sector of the flash memory, the sector containing the pointer, the first set of contiguous memory locations and the second set of contiguous memory locations.

8. The method of claim 1 further comprising:
determining a most recent one of the sets of data upon a power up event.

9. The method of claim 8 wherein the pointer is a word and determining a most recent one of the sets of data upon a power up event comprises:
bit shifting the pointer in an order from the last bit in the pointer to the first bit in the pointer.

10. The method of claim 1 further comprising:
determining a location of a most recent one of the sets of data upon a power up event, and
retrieving the most recent one of the sets of data upon the power up event.

11. A method of emulating an electrically erasable programmable read only memory using a flash memory, the method comprising:
storing successive sets of data to respective ones of a number of locations of a flash memory;
for each of the sets of data, setting one respective bit of a number of bits of a pointer stored in the flash memory before storing a next one of the sets of data, the one bit indicative of the location in the flash memory at which the respective set of data is stored; and
after a last bit in the pointer has been set, erasing a sector of the flash memory containing the pointer and the stored sets of data.

12. The method of claim 11 wherein setting one respective bit of a number of bits of a pointer stored in the flash memory for each of the sets of data comprises setting a single bit whose position in the pointer indicates a defined offset to the location of the respective set of data in the flash memory.

13. The method of claim 11 wherein setting one respective bit of a number of bits of a pointer stored in the flash memory for each of the sets of data comprises for each of a first one of the sets of data through an $n^{th}$ one of the sets of data, setting a single corresponding bit from a first bit to an $n^{th}$ bit whose position in the pointer indicates a defined offset to the location of the respective set of data in the flash memory.

14. The method of claim 11, further comprising:
storing further successive sets of data to respective ones of the number of locations of the flash memory; and
for each of the further sets of data, setting one respective bit of the pointer before storing a next one of the further sets of data, the at least one bit indicative of the location in the flash memory at which the respective further set of data is stored.

15. The method of claim 11 wherein storing successive sets of data to respective ones of a number of locations of a flash memory comprises storing a set of data stored in a random access memory upon each of a number of successive power down events.

16. The method of claim 11, further comprising:
determining a location of a most recent one of the sets of data upon an occurrence of a power up event by bit shifting the pointer in an order from the last bit in the pointer to the first bit in the pointer.

17. An apparatus to emulate an electrically erasable programmable read only memory using a flash memory, the apparatus comprising:
a flash memory;
means for storing successive sets of data to respective ones of a number of locations of contiguous memory of the flash memory;
means for setting one respective bit of a number of bits of a pointer stored in the flash memory for each of the sets of data, before storing a next one of the sets of data, the one bit indicative of the location in the flash memory at which the respective set of data is stored; and
means for erasing a sector of the flash memory containing the pointer and the stored sets of data after a last bit in the pointer has been set.

18. An apparatus to emulate an electrically erasable programmable read only memory using a flash memory, the apparatus comprising:
a flash memory;
a processor configured to store successive sets of data to respective ones of a number of locations of contiguous memory of the flash memory; to set one respective bit of a number of bits of a pointer stored in the flash memory for each of the sets of data, before storing a next one of the sets of data, the one bit indicative of the location in the flash memory at which the respective set of data is stored; and to erase a sector of the flash memory containing the pointer and the stored sets of data after a last bit in the pointer has been set.

19. The apparatus of claim 18 wherein the processor is further configured to determine a location of a most recent one of the sets of data upon an occurrence of a power up event by bit shifting the pointer in an order from the last bit in the pointer to the first bit in the pointer.

20. A processor-readable media storing instructions for causing a processor to store data, by:
storing successive sets of data to respective ones of a number of memory locations of a flash memory, each memory location comprising a number of contiguous words;
for each of the sets of data, setting one respective bit of a number of bits of a pointer stored in the flash memory before storing a next one of the sets of data, the one bit indicative of the memory location in the flash memory at which the respective set of data is stored; and after a last bit in the pointer has been set, erasing a sector of the flash memory containing the pointer and the stored sets of data.

21. The processor-readable media of claim 20 wherein the instructions cause the processor to set one respective bit of a number of bits of a pointer stored in the flash memory for each of the sets of data by setting a single bit whose position in the pointer indicates a defined offset to the location of the respective set of data in the flash memory.

22. The processor-readable media of claim 20 wherein the instructions cause the processor to set one respective bit of a number of bits of a pointer stored in the flash memory for each of the sets of data by for each of a first one of the sets of data through an $n^{th}$ one of the sets of data, setting a single corresponding bit from a first bit to an $n^{th}$ bit whose position in the pointer indicates a defined offset to the location of the respective set of data in the flash memory.

23. The processor-readable media of claim 20 wherein the instructions cause the processor to store data, further by:
    storing further successive sets of data to respective ones of the number of locations of the flash memory on each of a number of successive power down events; and
    for each of the further sets of data, setting one respective bit of the pointer before storing a next one of the further sets of data, the one bit indicative of the location in the flash memory at which the respective further set of data is stored.

24. The processor-readable media of claim 20 wherein the instructions cause the processor to store data, further by:
    determining a location of a most recent one of the sets of data by bit shifting the pointer in an order from the last bit in the pointer to a first bit in the pointer.

* * * * *